Figure 1:
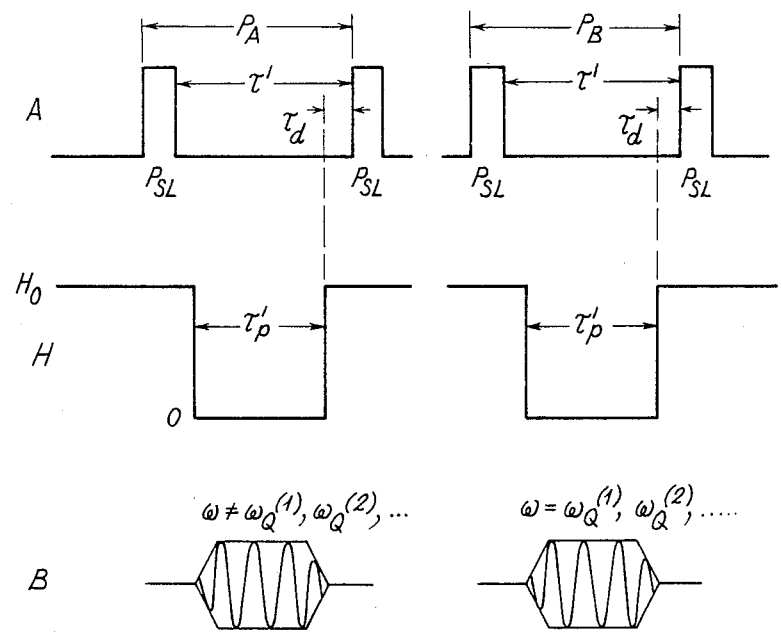

United States Patent [19]

Smith

[11] Patent Number: 4,887,034
[45] Date of Patent: Dec. 12, 1989

[54] METHODS AND APPARATUS FOR DETECTING CERTAIN COMPOUNDS

[75] Inventor: John A. S. Smith, London, England

[73] Assignee: National Research Development Corporation, London, England

[21] Appl. No.: 148,704

[22] Filed: Jan. 26, 1988

[30] Foreign Application Priority Data

Jan. 27, 1987 [GB] United Kingdom ............... 8701695

[51] Int. Cl.$^4$ ............................................. G01R 33/20
[52] U.S. Cl. ..................................................... 324/307
[58] Field of Search .............. 324/300, 307, 308, 309, 324/312, 315

[56] References Cited

U.S. PATENT DOCUMENTS

| 3,792,346 | 2/1974 | Gibby et al. | 324/314 |
| 4,166,972 | 9/1979 | King et al. | 324/310 |
| 4,296,378 | 10/1981 | King | 324/313 |
| 4,514,691 | 4/1985 | De Los Santos et al. | 324/301 |

FOREIGN PATENT DOCUMENTS 2057135 3/1981 United Kingdom .
2152674 8/1985 United Kingdom .

OTHER PUBLICATIONS

Bavin et al., "$^{14}$N Quadrupole Cross-Relaxation Spectroscopy of a Compound of Pharmacological Interest", Z. Naturforsch.41a, 195–199 (1986).
Sensitive Detection of $^{17}$O PQR by Nuclear Triple Resonance Method by R. Kado et al. Physica Letters, vol. 47A, No. 1, Feb. 25, 1974.
Nuclear Mag. Double Resonance Base on Strong rf mag Field Induced Coup. Bet. Spin Systems; by J. Selinger et al. Physical Review, vol. 11, No. 1, Jan. 1, '75.

Primary Examiner—Stewart J. Levy
Assistant Examiner—Louis M. Arana
Attorney, Agent, or Firm—Cushman, Darby & Cushman

[57] ABSTRACT

The detection of compounds containing both nuclei of a kind which exhibit nuclear magnetic resonance (nmr) and nuclei of a kind which exhibit nuclear quadrupole resonance (nqr), for example compounds containing both $^1$H and $^{14}$N nuclei, is carried out by subjecting a substance suspected of containing such a compound to a magnetic field and repetitively to three parallel activities A,H and B. Activity A comprises two similar rf pulse sequences $P_A$ and $P_B$ at the nmr frequency. Activity H is a temporary change in the value of the magnetic field, which may be a reduction to zero. Activity B is the application of additional rf signals. Activity H and/or activity B are different during each of the respective pulse sequences $P_A$ and $P_B$. The activity B rf signals are at one or more frequencies selected so that in combination with the activity H in at least one of the pulse sequences the subsequent nmr signal is modified if such a compound is present. The difference in magnitude of the nmr signals obtained following the two types of rf pulse sequence is then measured.

18 Claims, 6 Drawing Sheets

METHODS AND APPARATUS FOR DETECTING CERTAIN COMPOUNDS

The invention relates to methods and apparatus for detecting certain compounds. More particularly the invention relates to methods and apparatus for detecting compounds containing both nuclei of a first kind which exhibit nuclear magnetic resonance (nmr) and nuclei of a second kind which exhibit nuclear quadrupole resonance (nqr). Examples of such compounds are a range of narcotics and explosives such as cocaine, heroin, TNT, RDX and PETN.

Nuclei of the first kind usually have a spin quantum number of $\frac{1}{2}$ and include the nuclei $^1H, ^{19}F, ^{31}P$ which give rise to strong and easily detectable nmr responses in the presence of a magnetic field. The nmr frequency of such nuclei is given by $\omega = \gamma H$ where $\omega$ is the angular frequency, $\gamma$ is the gyromagentic ratio specific to that nucleus and H is the intensity of the magnetic field. The nmr frequency thus depends on the value of the applied magnetic field. Nuclei of the second kind have a spin quantum number greater than $\frac{1}{2}$ and include $^{11}B, ^{14}N, ^{27}Al, ^{35}Cl$. They exhibit characteristic frequencies known as their quadrupole resonance frequencies. These frequencies are usually much less dependent on the intensity of the applied magnetic field. For a given nucleus these frequencies depend on the molecular structure within which it is contained and therefore provide a sensitive identification of individual compounds containing such nuclei. The examples of narcotic and explosive substances quoted above are compounds containing both the $^1H$ nucleus and the $^{14}N$ nucleus and the invention is particularly useful in the detection of compounds containing these nuclei, although the invention can also be used to detect compounds having different combinations of nuclei.

It has been suggested that by causing any nqr response, if present, to change the intensity of an induced nmr signal by transfer of energy between the two kinds of nuclei the presence of substances containing both kinds of nuclei could be detected. This phenomenon is known as double resonance and can be made to occur, for example, when the nmr frequency is made to coincide with the nqr frequency, a condition known as level-crossing.

One such suggestion is described in British Patent No. 2057135. In that specification it is proposed to generate an nmr echo signal by the application of a pair of rf pulses of appropriate frequency in a magnetic field. The magnitude of this echo signal is measured. The magnitude of the magnetic field is then changed to a value at which the nmr frequency coincides with the nqr frequency of a nucleus of the second kind in a compound which it is desired to detect so shortening the nmr spin-lattice relaxation time, a phenomenon known as cross-relaxation. The magnetic field intensity is then returned to its initial value and a similar pair of pulses applied and the echo signal again measured. If there has been cross relaxation when the intensity of the magnetic field was at its changed value then the echo signal response after the second pair of pulses will be different. This will indicate the presence of the compound. However, the two-pulse sequence described is intended to generate a so called "solid-echo" signal and to be effective the two pulses must be in phase quadrature.

Another method is described in U.S. Pat. No. 4,296,378. However the method described there does not distinguish between substances in which cross-relaxation occurs and those substances containing nuclei of the first kind with similar nmr spin-lattice relaxation times.

Another suggestion for detecting the presence of certain substances is described in published PCT Application No. WO84/04173. The method described there is based on the assumption that in substances of interest the $^1H$ nuclei have long spin-lattice relaxation times ($T_1$) and short spin-spin relaxation times ($T_2$). There are, however, many hazardous materials which it may be desired to detect which do not fit into this category. One example is ammonium nitrate in which $T_1$ is relatively short and $T_2$ is relatively long. Another example is cocaine where $T_1$ is short both in high and low magnetic fields.

It is an object of the invention to provide a method and apparatus capable of detecting any one of a large range of compounds in which double resonance can be made to occur.

According to the invention in one aspect a method of detecting the presence of one or more compounds containing both nuclei of a first kind which exhibit nmr and nuclei of a second kind which exhibit nqr comprises subjecting material suspected of containing such a compound to a magnetic field and successively and repetitively to two types of sequence, each sequence comprising an rf pulse or pulse train at the nmr frequency of the first kind of nucleus in the said magnetic field followed by a time interval in which in at least one of the sequences there is a predetermined change in the magnitude of the said magnetic field, and during the time interval in at least one of the types of sequence applying rf signals at one or more frequencies selected so that in combination with the aforesaid change in the magnitude of the magnetic field the subsequent nmr signal is modified if such a compound is present, and measuring the difference in the magnitude of the nmr signals obtained following the two types of sequence.

Where rf pulse trains are employed then these trains can comprise spin locking pulse sequences comprising 90° pulses of the form $90°_0(90°_{90}-2\tau)$ where $\tau$ is a time delay and n is an integer value one or more. Alternatively the rf pulses may comprise single or multiple 90° pulses. The two types of sequence may be applied alternately. Alternatively, a plurality of one type of sequence is first applied and is then followed by an equal plurality of the other type of sequence.

In one embodiment of the invention the changes in the magnitude of the magnetic field are changes to a zero or low value and rf signals at the nqr frequency of one or more compounds which it is desired to detect are applied in the time interval of one of the types of sequence. In addition rf signals not at the nqr frequency of any of the compounds of interest may be applied during the corresponding time interval of the other of the types of sequence.

In another embodiment of the invention the change in the magnitude of the static magnetic field during one of the types of sequence is a stepped change with at least one of the steps being held at a value in which level crossing between nuclei of the two kinds takes place if corresponding ones of said compounds are present. The rf signals are applied when the magnetic field reaches a zero value in order to destroy any residual nmr signal.

In yet another embodiment of the invention the changes in the magnitude of the static magnetic field are different in the respective time intervals of each of the types of sequence. One of the changes is such as to cause the nmr frequency of the first kind of nuclei to coincide with one of the nqr frequencies of nuclei of the second kind in a compound which it is desired to detect. Simultaneously therewith rf signals are applied at a frequency corresponding to a different nqr frequency of such nuclei.

According to the invention in another aspect apparatus for detecting the presence of one or more compunds containing both nuclei of a first kind which exhibit nmr and nuclei of a second kind which exhibit nqr comprises:

means for applying a magnetic field to material to be tested;

means for applying rf pulses to such material of predetermined radio frequency, intensity, duration and phase at the nmr frequency of nuclei of the first kind;

means for temporarily changing the magnitude of the said magnetic field in a predetermined manner;

means for applying rf signals to such materials during the time of said temporary change of magnitude of the said magnetic field said signals being of one or more predetermined frequencies; and means for measuring the free induction signal from nuclei of the first kind.

In carrying out the invention separate rf coil means may be provided to which the said rf pulses and the said rf signals respectively are applied. Two separate receiving channels may also be provided to receive different ones of free induction signals from nuclei of the first kind.

Figure 2:
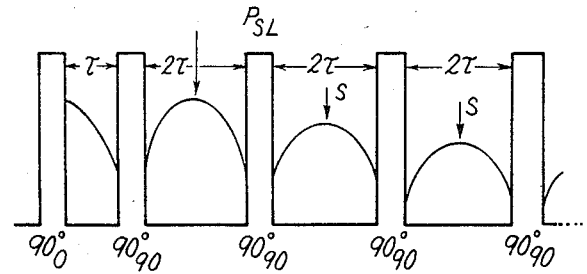
Figure 4:
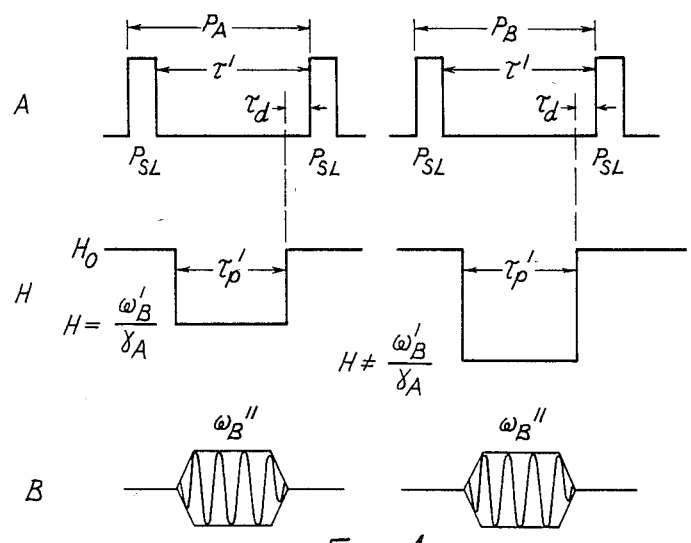
Figure 5:
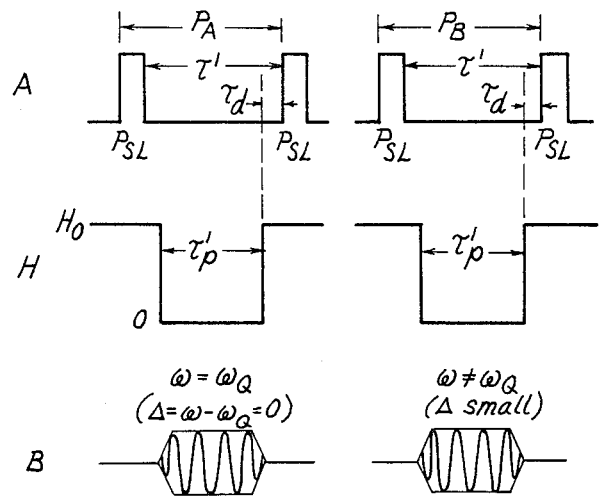
Figure 6:
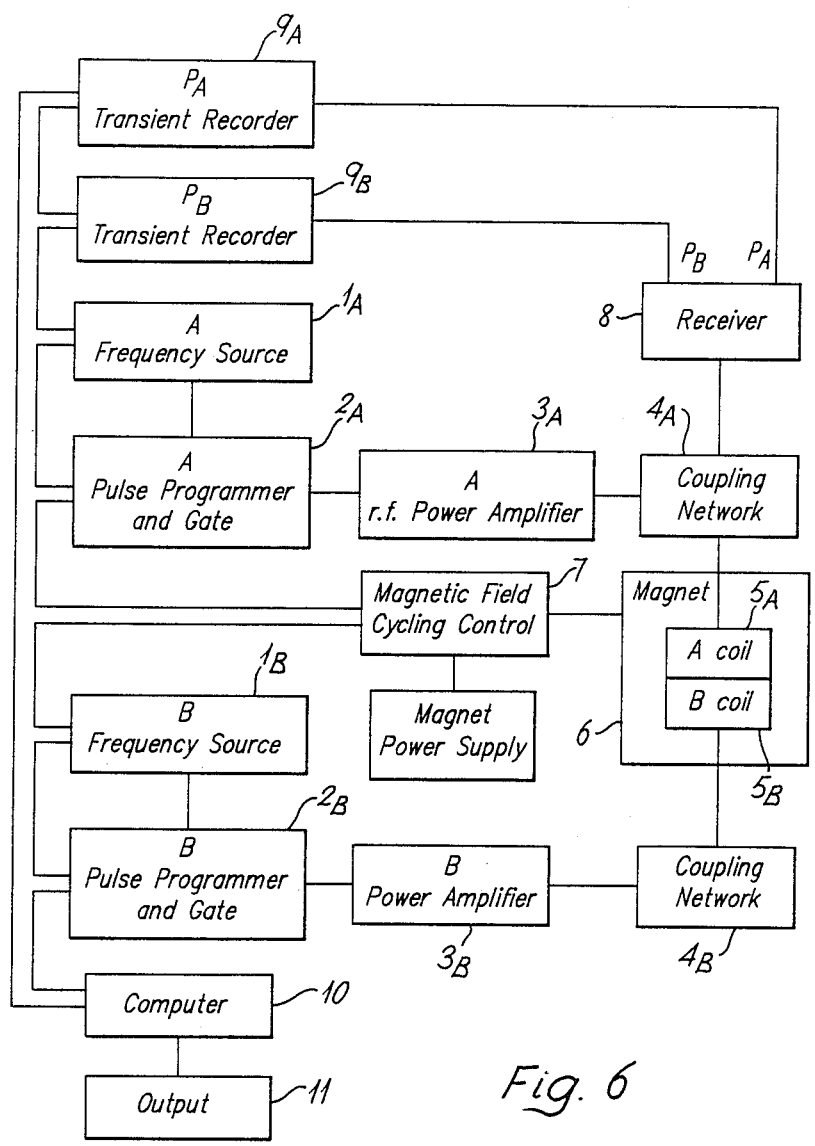

In order that the invention may be more fully understood reference will now be made to the accompanying drawings in which:

FIG. 1 shows a timing diagram of rf pulses, switched magnetic fields and applied rf signals that can be used in a method embodying the invention, FIG. 2 shows in detail one rf pulse train that may be used in the method of FIG. 1, FIGS. 3,4 and 5 shows alternative timing diagrams of pulses, switched magnetic fields and applied rf signals used in methods embodying the invention, FIG. 6 shows apparatus embodying the invention in block diagrammatic form, and FIGS. 7,8a,8b,9 and 10 give results obtained by using the apparatus of FIG. 6 in accordance with one or other of the techniques shown in FIGS. 1,3,4 and 5.

Referring now to FIG. 1, there are three parallel activities that take place, which are labelled A, H and B. The A activity comprises the application of two types of sequence labelled $P_A$ and $P_B$. Both types of sequence include similar rf pulse trains indicated by the composite pulse envelope $P_{SL}$ followed by a time interval $\tau'$. The activity H relates to the application of a magnetic field which is normally held at a constant value $H_0$ but within the interval $\tau$ it is switched to a zero value for a time $\tau'p$ which is less than $\tau'$. There is a delay time $\tau_d$ between the end of interval $\tau'p$ and of the interval $\tau'$ and a further delay time given by $\tau' - \tau_d - \tau'_p$ between the end of pulse train $P_{SL}$ and the commencement of interval $\tau'p$. In the time interval $\tau'p$ an activity labelled B takes place. Activity B consists of the application of an rf signal as shown by the B line. This signal may have one or more different frequencies as will be described hereafter.

The pulse envelope $P_{SL}$ itself comprises single or multiple 90° pulses or one or more pulse trains in the form of a multiple pulse spin-locking sequence which is shown in more detail in FIG. 2. The spin-locking pulse sequence comprises a first 90° rf pulse followed by a train of further 90° pulses whose rf phase is in quadrature with the first pulse. The first pulse is written as $90°_0$ and subsequent pulses as $90°_{90}$. The time spacing between the first pulse and the commencement of the series of $90°_{90}$ pulses is $\tau$ and the time spacing between each of the $90°_{90}$ pulses of the series is $2\tau$. The complete pulse sequence can therefore be written as $90°_0(90°_{90}-2\tau)_n$ where n is an integer of value one or more. Provided that the frequency of the rf pulses is chosen relative to the magnitude of the applied magnetic field $H_0$ so as to satisfy the relationship $\omega=\gamma H_0$ where $\omega$ is the angular frequency of the rf pulses and $\gamma$ is the gyromagnetic ratio of nuclei of the first kind, then nuclear magnetic resonance will be induced and a free induction signal will be generated after each individual pulse of the sequence. This signal peaks during the time interval $2\tau$ between successive 90° pulses and its peak value is measured and stored for later use. The entire pulse train that is shown in FIG. 2 is designated by the pulse envelop $P_{SL}$ in FIG. 1.

Turning now back to FIG. 1 attention is directed to the line marked B which shows the application of rf signals during the time that the magnetic field H has a zero value. In the time interval in the sequence $P_A$ this signal is chosen to have a frequency which is not equal to any of the nqr frequencies of compounds suspected of being included in the material under investigation. However, in the sequence $P_B$ one or more frequencies are applied either simultaneously or sequentially which are made equal to at least one of the nqr frequencies of suspected compounds.

In use of the timing diagram shown in FIG. 1 the sequences $P_A$ and $P_B$ are applied successively and repetitively. The actual overall sequence can for example comprise a series of $P_A$=sequences followed by an equal series of $P_B$ sequences, as $P_AP_AP_A\ldots P_BP_BP_B\ldots$. Alternatively the sequences can be applied alternately i.e. $P_AP_BP_AP_B\ldots$.

Measurements of the free induction signals for both the $P_A$ and the $P_B$ sequences are taken using quadrature phase-sensitive detectors and are added separately for each sequence. The summed free induction signals may be Fourier transformed to obtain the absorption-mode signal which is then integrated to improve the signal-to-noise ratio. If no suspected material is present then there will be no difference in the magnitudes of the two integrations. However, if any such material is present then there will be a difference. The existence of this difference indicates the presence of one or more suspected compounds containing nuclei at the frequencies of the B signals applied during pulse sequence $P_B$.

To facilitate understanding of the way in which the above timing diagram functions, the two kinds of nucleus that may be present in a material being examined are termed in the following discussion as A nuclei and B nuclei. the application of successive and repetitive sequences $P_A$ and $P_B$ may generate pseudo-equilibrium conditions in the A-spin system in the sense that the A populations are maintained away from their thermal equilibrium values. Use of pseudo-equilibrium conditions has the advantage that the material being examined can be immediately subject to the above described pulse sequences and there is no need to wait for the material to acquire a finite magnetisation in the applied magnetic field.

The magnetic field as shown in the H line in FIG. 1 is cycled to zero adiabatically but slowly enough to ensure that the population ratios of both the A and B spin systems become equal at level crossing during the change. Level crossing will occur as the magnetically-split A-spin levels, equal to $\gamma_A H$, collapse to zero (or increase from zero) and cross over the B-spin levels, the quadrupole interaction of which ensures a non-zero frequency, $w_B$, even in zero field. At level crossing, when the condition $\omega_B = \gamma_A H$ is satisfied, the A and B spin temperatures, $T_A, T_B$ defined by the population ratios $$\frac{N^A\text{upper}}{N^A\text{lower}} = e^{-E_a/kT_A}, \frac{N^B\text{upper}}{N^B\text{lower}} = e^{-E_B/kT_B},$$

become equal in a time $T_{CP}$, the cross-polarisation time. The field cycling must therefore be slow enough in this train to ensure that the time spent at the level-crossing condition be longer than $T_{CP}$.

During the time interval $\tau_p'$ in sequence $P_A$, off-resonant rf radiation of angular frequency w, with or without frequency modulation may be applied, as shown by the B line in FIG. 1, to the B spins in zero or low magnetic field. Frequency w is off-resonant with respect to the B quadrupole resonance frequencies $\omega_Z$. During time $\tau_p'$ in sequence $P_B$ of B-spins are subject, in zero or low magnetic field, to resonant rf radiation with or without frequency modulation at saturation level at one or more of their quadrupole resonance frequencies $\omega_Q^{(1)}, \omega_Q^{(2)}$, at the temperature of the object. For a three-level spin system like $^{14}N$ (I=1), with three resonant frequencies labelled $\omega_x, \omega_y, \omega_z$, usually $\omega_x$ and/or $\omega_z$ will be saturated and the power spectrum of the B pulse can contain any number of different $\omega_x$ (and/or $\omega_z$) frequencies characteristic of all nitrogen-containing compounds in the sample whose presence is to be detected. In this way all such compunds are simultaneously irradiated. On remagnetising adiabatically the saturated $^{14}N$ (B) levels pass on their energy to the $^1H$ (A) levels on level crossing. The magnetic field and irradiation cycle may be repeated several times during the time $\tau_p'$ to produce multiple level-crossing and enhance sensitivity. Finally, the reduced $^1H$ signal is observed by a free induction signal accumulator in the time sequence $P_B$ relative to the corresponding signal in the time sequence $P_A$.

This timing sequence shown in FIG. 1 is related to that used in double resonance by level crossing experiments (drlc). The technique is particularly suitable for materials in which both the A nuclei and the B nuclei have medium to long spin-lattice relaxation times $T_1$ and with a reasonable high proportion of B nuclei to A nuclei. This occurs for the A nucleus $^1H$ and the B nucleus $^{14}N$ in many explosives.

Figure 3:
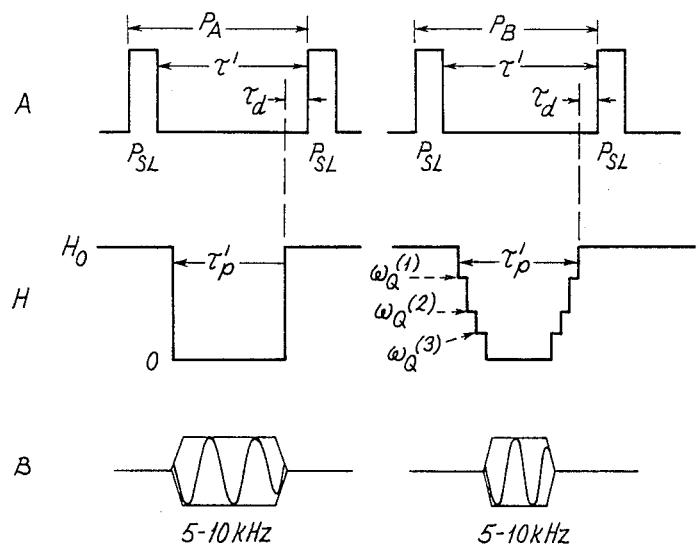

For compounds in which the cross-polarisation time $T_{CP}$ is long but the B nuclei are relatively abundant, as in the $^{14}NO_2$ group in some explosives, the technique of FIG. 3 may be used. In this technique the pulse train $P_{SL}$ is followed by time intervals in which the magnetic field is changed as in FIG. 1, but the nature of the change and the nature of the rf signals applied in the time intervals are different. For the highest sensitivity time $\tau'$ should be equal to or longer than the time $T_1$ for the A nucleus. The magnetic field cycle is adiabatic but may be too fast to produce equalisation of the A and B spin temperatures during level crossing. During time $\tau_p'$ in sequence $P_A$ the magnetic field is cycled straight to zero and simultaneously the A dipolar system saturated with low frequency radiation, typically 10 kHz, to destroy any remaining A magnetisation. During time $\tau_p'$ in sequence $P_B$ the same sequence of events is used to except that the field cycle is now conducted slowly enough for equalisation of the A and B spin temperatures at level crossing to occur e.g. by halting for a time $T_{CP}$ or longer at one or more level crossing fields in which the A nmr frequency matches in turn one or more of the B quadrupole resonance frequencies of each of the materials to be detected, both during demagnetisation and remagnetisation. During the latter the B nuclei quadrupole levels share their surplus populations, acquired during the former, with the A nuclei spins in sequence, producing an increase in the A signal. If $T_1$ (A) is short, time $\tau'$ (and $\tau_d$) may be made so short as to reduce or eliminate many A responses from solids usually encountered in the objects to be examined; only materials containing B nuclei whose quadrupole resonance frequencies are matched at the level crossing steps will then give significant signals.

For compunds in which $T_1(A) >> T_1(B)$, $\tau'$ can be made much shorter than $T_1(A)$ and the magnetic field steps, now needed on remagnetisation only, are made to last much longer than the cross-polarisation time $T_{CP}$ so that considerable re-polarisation of the A spins by relaxation recovery occurs in the level-crossing field due to thermal contact with the B spins. Away from the level crossing condition re-polarisation is much slower. Again, fast repetition of the pulse units may reduce the background signal considerably.

The pulse trains may be called double resonance by adiabatic remagnetisation (dram).

The technique of FIG. 4 is appropriate for compounds in which the time $T_1$ for the A nucleus is much longer than $T_1$ for the B nucleus and the B nucleus is in low abundance, as for $^{14}N$ in heroin and other narcotics. Under these circumstances, if the A Zeeman levels are matched in low magnetic fields with a pair of quadrupole-split B levels, after a short period $T_{CP}$ in which the two spin systems come to a common spin temperature, the combined system A+B thereafter relaxes with a spin-lattice relaxation time $(T_1)$eff which is the weighted mean of the two individual relaxation times $T_1(A)$ and $T_1(B)$ $$(T_1)_{\text{eff}} = \left[\left(\frac{\epsilon}{1+\epsilon}\right)\frac{1}{T_1(B)} + \left(\frac{1}{1+\epsilon}\right)\frac{1}{T_1(A)}\right]^{-1}$$

in which $\epsilon$ is equal to (or proportional to) the number ratio of B to A spins $N_B/N_A$. If $\epsilon T_1(A)/T_1(B) >> 1$, the method has high sensitivity for the detection of B spins.

In this sequence as shown in FIG. 4, $\tau'$ is set close to $T_1$ in the field H. During time $\tau_p'$ in sequence $P_A$ the magnetic field is cycled adiabatically to a magnetic field in which the A magnetic resonance frequency is close to, but not equal to, one of the B quadrupole resonance frequencies characteristic of the material it is wished to detect. During time $\tau_p'$ in sequence $P_B$ the magnetic field is cycled to a value such that the A magnetic resonance frequency is exactly matched to the peak B frequency response. The A-nucleus spin-lattice relaxation is much faster during sequence $P_B$ than during sequence $P_A$, resulting in a faster loss of polarisation during $P_B$ and $P_A$ and very different accumulated signals at the two detectors. This difference may be even further increased by level crossing effects in the appropriate circumstances e.g. when $T_1(A)$ is short.

In a simplier version of this cycle which is applicable when the measurement field $H_o$ and the cross-relaxation field H are close in magnitude, pulse envelope $P_{SL}$ comprises a saturation recovery sequence of 90° pulses with separations comparable to $T_1(A)$ in field $H_o$. In sequence $P_A$, the magnetic field is set to $H_o$ and during $P_B$ to H for an equal time, the A nmr frequency being changed accordingly. The A-nucleus spin-lattice relaxation is much faster during sequence $P_B$ than during sequence $P_A$, resulting in a partial recovery of the A signal during sequence $P_B$ relative to that in $P_A$ and different accumulated signals at the two detectors.

In another version of the cycle, the magnetic field during time $\tau_p'$ of sequence $P_B$ is set to half the magnetic field required for matching so as to observe the narrower two-proton relaxation jumps.

In all versions of this cycle appropriate to spin-1 B nuclei such as $^{14}N$, rf signals are applied in time $\tau_p'$ in both sequences $P_A$ and $P_B$ of frequency equal to another quadrupole resonance frequency differing from that which is being cross-relaxed. If, for example, the cross-relaxation magnetic field is matched to one nqr frequency $\omega_B'$ irradiation at another nqr frequency $\omega_B''$ causes positive enhancement of the recovered A magnetisation, providing thereby both an increase in sensitivity and a highly sensitive identification of the material present in the object.

This technique is related to a group of methods known collectively as double resonance by cross relaxation (drcr); it can detect $^{14}N$ signals in crystalline solids, in plastics and also in liquids and gels with long correlation time ($10^{-5}$ and $10^{-6}S$).

The technique of FIG. 5 is appropriate to compounds in which the quadrupolar nucleus B has half-integral spin (eg $I=3/2$) and $T_1(B)$ is short, such as the $^{35}Cl$, $^{37}Cl$ nuclei in cocaine hydrochloride. During time $\tau_p'$ in sequence $P_A$ as shown in FIG. 5 the magnetic field is switched as fast as possible down to or close to zero and intense rf radiation applied at the B quadrupole resonance frequency ($\omega_Q$) of the compound to be detected at the given temperature. During time $\tau_p'$ in sequence $P_B$ the cycle is the same except that the rf radiation is off-resonance by a carefully specified shift $\Delta = \omega - \omega_Q$. During the second cycle the effective frequency "seen" by the B nuclei in the rotating frame is $\omega - \omega = \Delta$, and if this lies within the A dipolar absorption edge the A spins become polarised provided that $T_1(B)$ is short. Fast return to higher field with the minimum value of $\tau_d$ "captures" this polarisation with the A Zeeman levels resulting in an enhanced A signal if $w < \omega_Q$ and a diminished (or inverted) A signal if $w < \omega_Q$. If the timing period $\tau'$ is made so short that the A signal is saturated, any remaining signal in zero field being destroyed by an initial burst of radiation within the A dipolar absorption edge, the A detector will register no response as will the B detector *unless* the B-nucleus whose frequency is irradiated is present. As in the technique of FIG. 3 it is possible in this way to eliminate or reduce much of the background A-signal from other A-containing materials in the object under examiniation.

This technique is related to experiments based on double resonance by thermal mixing (drtm).

Apparatus suitable for carrying out the methods shown in FIGS. 1,3,4 and 5 is shown in FIG. 6. The apparatus has two rf channels. These channels provide the pulses and the signals for the A activity and the B activity respectively. The A rf channel comprises an A frequency source $1_A$, a pulse programmer and gate $2_A$, an rf power amplifier $3_A$ and a coupling network $4_A$ which couples the output of the rf amplifier $3_A$ to an rf coil $5_A$. Likewise the B rf channel comprises a B frequency source $1_B$, a pulse programmer and gate $2_B$, an rf power amplifier $3_B$ and a coupling network $4_B$ which couples the output of power amplifier $3_B$ to an rf coil $5_B$.

The two coils $5_A$ and $5_B$ are positioned to provide rf fields to at least part of material under investigation and in addition a dc magnet 6 of controllable intensity provides a static magnetic field in which the material is immersed. The intensity of the magnetic field is controlled by a magnetic field cycling control 7. Received rf signals are detected in coil $5_S$ and the detected signals are fed to a two-channel receiver 8 and thence to either one of two transient signal recorders $9_A$ and $9_B$. Control of the frequency sources $1_A$ and $1_B$, of the pulse programmers and gates $2_A$ and $2_B$, the magnetic field cycling control 7 and the transient recorders $9_A$ and $9_B$ is carried out by means of a computer 10 which takes the signals recorded in the transient recorders $9_A$ and $9_B$ processes them and provides an output 11.

The apparatus of FIG. 6 is programmed by computer 10 to operate in accordance with any one of the methods shown in FIGS. 1,3,4 or 5. The transient recorders $9_A$ and $9_B$ are triggered to detect the whole free induction decay signal, or in the case of a spin-locking sequence, only at the echo maxima. In a solid these signals decay in a time which is closer to $T_{1p}$ than $T_2$, giving a much greater time for signal sampling. The sampling of the received signal can be performed for example by pulse gated integration or by fast digitisation and accumulation in the memory of the computer followed by Fourier transformation and integration of the absorption signal. It is desirable to use such accumulation techniques since the materials to be detected may be considerably diluted as, for example, being present in luggage and their signals will therefore be reduced by the presence of inert or harmless hydrogen-containing materials whose response is not changed when the selected perturbation is applied to the B spin system. In the case of a large object being examined, such as a piece of luggage, it may be necessary to examine it section by section my means of a sequentially switched array of A and B rf coils in order to keep the power requirements for the two amplifiers $3_A$ and $3_B$ within reasonable limits.

Examples of results obtained from the use of the apparatus of FIG. 6 are described below with reference to FIGS. 7,8,9 and 10. In each case the most appropriate one of the methods of FIGS. 1,3,4 or 5 is used. The A nuclei in each case is the $^1H$ nucleus. The B nucleus is $^{14}N$ as present in various narcotics and explosives or else the $^{35}Cl$ or $^{37}Cl$ nucleus present in cocaine hydrochloride.

Figure 7:
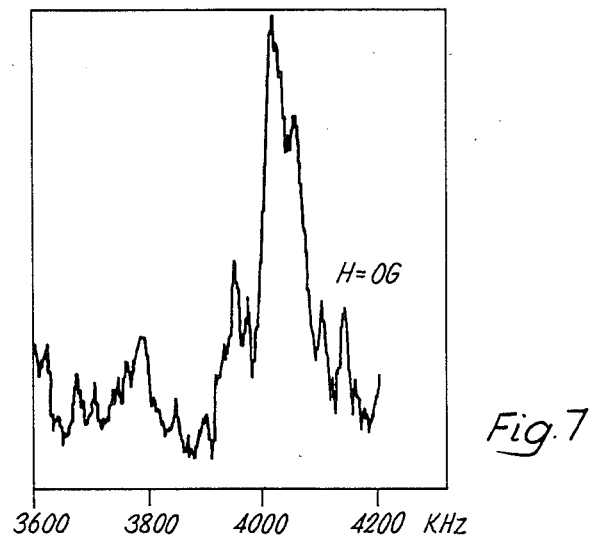

The technique of FIG. 1 detects a change in the $^1H$ magnetisation due to heroin under the following conditions. In the A channel a single 90° pulse is used of pulse width 3 μs and the $^1H$ free induction decay at 40.18 MHz from a 3g sample is integrated in a box-car integrator of gate width 2 μs and time constant 0.1s. The magnetic field cycle $P_AP_A$. . . $P_BP_B$. . . is set to $\tau'=4s, \tau_p'=0.6s$, $\tau_d=0.1s$ and the B channel generates an rf field of amplitude about 0.2 mT. A change in signal of about 35 mV is produced when the frequency in the B channel is set to 4.024 or 4.063 MHz at 295K. FIG. 7 shows the complete high-frequency $^{14}N$ spectrum produced by stepping the frequency after each sequence. The line is a doublet of splitting 39 kHz and has an overall width 59 kHz. Under similar conditions, cocaine free base ("crack") gives signals at 4.245 and 4.260 MHz of width 30 kHz at the same temperature. The invention is therefore capable of detecting and distinguishing between these two compounds at room temperature.

Figure 8A:
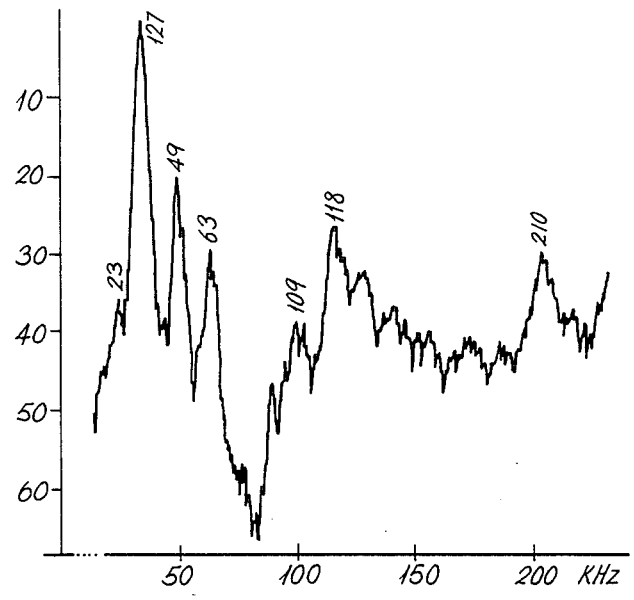
Figure 8B:
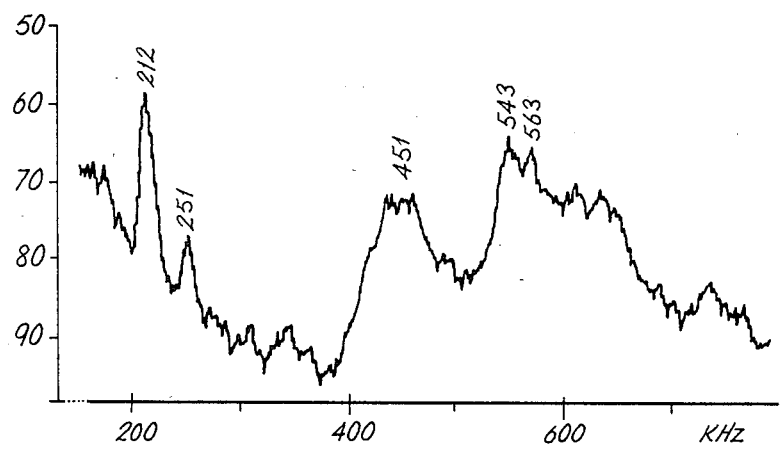

The techniques of FIGS. 3 and 4 give strong $^{14}NH_4+$ and $^{14}NO_3-$ signals from 3 g samples of ammonium nitrate under the following conditions. The A-channel is as in the previous paragraph. The magnetic field cycle is that described in FIG. 4 with a single $^1H$ 90° pulse and $\tau'=5.5s$, $\tau_p'=0.3s$ and $\tau_d=0.7s$, the field being stepped after each sequence. As shown in the spectrum of FIG. 8a the $NH_4+$ signals are detected at level-crossing magnetic fields equivalent to $^1H$ frequencies of 48.9, 64.8 and 11.68 kHz. With the parameters changed to give $\tau'=8.6s$, $\tau_p=1.2s$ and $\tau_d$ as before then the equivalent $^1H$ frequencies to detect the $^{14}NO_3-$ ion are at 103.9 449.1 and 549.0 kHz. This is shown in the spectrum of FIG. 8b. A two-proton relaxation jump for the latter appears near 212 kHz and is sharp and strong enough to be used in detection. Mixtures of $(NH_4)_2SO_4$ and $(NH_4)NO_3$ show signals from both, whose relative intensity can be used to analyse for their relative proportions.

Figure 9:
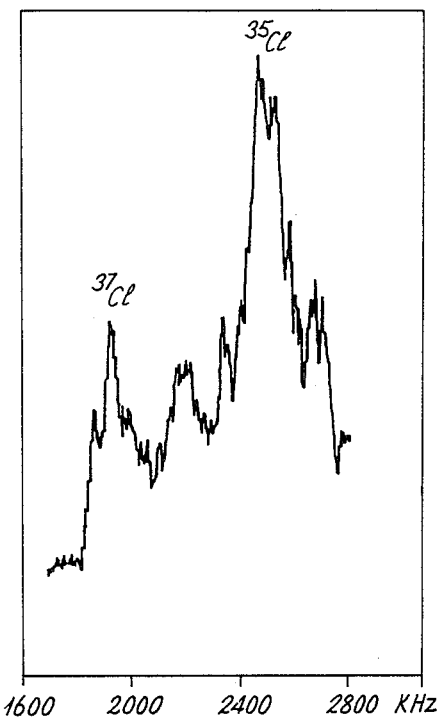

The techniques of FIGS. 1 and 5 will detect signals from $^{35}Cl$, $^{37}Cl$ in cocaine hydrochloride. The A channel settings are as before. The magnetic field cycle has $\tau'=5s$, $\tau_p'=0.6s$, $\tau_d=0.1s$ and the B channel has rf radiation whose frequency is stepped from 1.7 to 2.8 MHz with an $H_1^{rot}$ field of about 0.15 mT. The $^{35}Cl$ signals are seen at 2.547 MHz and the signals from $^{37}Cl$ at 1.998 MHz at room temperature. The complete spectrum is shown in FIG. 9. This $^{35}Cl$ frequency is unique to cocaine hydrochloride and is most unlikely to be found in any other materials encountered in luggage, parcels or the like.

Figure 10:
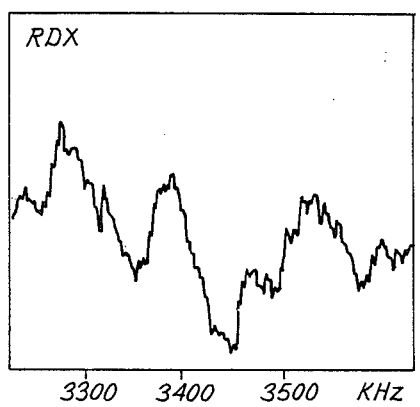

FIG. 10 shows the $v_y$ lines near 3,400 kHz in the $^{14}N$ spectrum of the high explosive RDX. The recording was made by the same method as was used for $NH_4NO_3$ but with timing setings of $\tau'=50s$, $\tau_p'=1s$ and $t_d=0.7s$.

I claim:

1. A method of detecting the presence of one or more compounds containing both nuclei of a first kind which exhibit nmr and nuclei of a second kind which exhibit nqr comprising subjecting material suspected of containig such a compound to a magnetic field and successively and repetitively to two types of sequence, each sequence comprising an rf pulse or pulse train at the nmr frequency of the first kind of nucleus in the said magnetic field followed by a time interval in which in at least one of the sequences there is a predetermined change in the magnitude of the said magnetic field, and during the time interval in at least one of the types of sequence applying rf signals at one or more frequencies selected so that in combination with the aforesaid change in the magnitude of the magnetic field the subsequent nmr signal is modified if such a compound is present, and measuring the difference in the magnitude of the nmr signals obtained following the two types of sequence.

2. The method as claimed in claim 1 in which the rf pulse train comprises a sequence of 90° pulses.

3. The method as claimed in claim 2 in which the pulse train comprises a spin locking pulse sequence comprising 90° pulses of the form $90°_0-\tau-(90°_{90}-2\tau)_n$ where $\tau$ is a time delay and n is an integer of value one or more.

4. The method as claimed in claim 1 in which the rf pulse is a single 90° pulse.

5. The method as claimed in claim 1 in which the two types of sequence are applied alternately.

6. The method as claimed in claim 1 in which a plurality of one type of sequence is first applied and is then followed by an equal plurality of the other type of sequence.

7. The method as claimed in claim 1 in which there are predetermined changes in the magnitude of the said magnetic field in both types of sequence.

8. The method as claimed in claim 1 in which changes in the magnitude of the magnetic field are changes to a zero or low value and rf signals at the nqr frequency of one or more compounds which it is desired to detect are applied in the time interval of one of the types of sequence.

9. The method as claimed in claim 8 in which rf signals which are not at the nqr frequency of any of the compounds of interest are applied during the corresponding time interval of the other of the types of sequence.

10. The method as claimed in claim 1 in which the change in the magnitude of the static magnetic field during one of the types of sequence is a stepped change with at least one of the steps being held at a value in which level crossing between nuclei of the two kinds take place if corresponding ones of said compounds are present.

11. The method as claimed in claim 10 in which the rf signals are applied when the magnetic field reaches zero value in order to destroy any residual nmr signal.

12. The method as claimed in claim 1 in which the changes in the magnitude of the magnetic field are different in the respective time intervals of each of the types of sequence.

13. The method as claimed in claim 12 in which one of the changes in the magnitude of the magnetic field is such as to cause the nmr frequency nuclei of the first kind to coincide with one of the nqr frequencies of nuclei of the second kind in a compound which it is desired to detect, wherein rf signals are applied simultaneously to said changes in magnitude of the mangetic field, at a frequency corresponding to a different nqr frequency of such nuclei.

14. Apparatus for detecting the presence of one or more compounds containing both nuclei of a first kind which exhibit nmr and nuclei of a second kind which exhibit nqr comprising:
   means for applying a magnetic field of a predetermined magnitude to material to be tested;
   means for applying rf pulses to such material of predetermined radio-frequency, intensity, duration and phase at the nmr frequency of said nuclei of the first kind;
   means for temporarily changing said magnetic field to a different magnitude in a predetermined manner and then returning the magnetic field to said predetermined magnitude.
   means for applying rf signals to such material during the time of said temporary change of magnitude of the said magnetic field, said signals being of one or more predetermined frequencies; and
   means for measuring the free induction signal from said nuclei of the first kind.

15. Apparatus as claimed in claim 14 in which separate rf coil means are provided to which the said rf pulses and the said rf signals respectively are applied.

16. Apparatus as claimed in claim 14 in which two separate receiving channels are provided to receive different ones of free induction signals from nuclei of the first kind.

17. Apparatus for detecting the presence of one or more compounds having both nuclei of a first kind which exhibit nmr and nuclei of a second kind which exhibit nqr comprising:

means for applying a magnetic field of predetermined magnitude to material to be tested for the presence of said compounds;

means for applying rf pulses of predetermined radio-frequency, intensity, duration and phase at the nmr frequency of said nuclei of the first kind to said material;

means for temporarily changing the magnitude of said magnetic field in a predetermined manner, at a time after said rf pulses are applied;

means for applying second rf signals to said material during the time of said temporary change of magnitude of said magnetic field, said signals being of one or more predetermined frequencies selected such that in combination with the change in magnitude of the magnetic field, an nmr signal will be changed if one of said compounds is present;

means for returning the magnitude of said magnetic field to said predetermined magnitude;

means for applying second rf pulses corresponding to said first rf pulses to said material; and means for measuring the free induction signal from said nuclei of the first kind.

18. Apparatus for detecting the presence of one or more compounds containing both nuclei of a first kind which exhibit nmr and nuclei of a second kind which exhibit nqr comprising:

means for applying a magnetic field of predetermined magnitude to a material to be tested;

means for applying rf pulses to said material of predetermined radio-frequency, intensity, duration and phase at the nmr frequency of said nuclei of the first kind;

means for temporarily changing said magnetic field to a different magnitude in a predetermined manner and then returning the magnetic field to said predetermined magnitude;

means for applying first and second rf signals to such material during different ones of the times of said temporary change of magnitude of said magnetic field, said first and second rf signals each comrprising one or more different respective frequencies;

means for detecting the free induction signal from nuclei of the first kind; and means for comparing the respective detected signals arising after the application of the respective first and second rf signals.

* * * * *